(12) United States Patent
Sasaki

(10) Patent No.: US 6,640,429 B2
(45) Date of Patent: Nov. 4, 2003

(54) METHOD OF MAKING MULTILAYER CIRCUIT BOARD

(75) Inventor: Masayuki Sasaki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/074,899

(22) Filed: Feb. 12, 2002

(65) Prior Publication Data

US 2002/0084104 A1 Jul. 4, 2002

Related U.S. Application Data

(62) Division of application No. 09/690,375, filed on Oct. 17, 2000.

(30) Foreign Application Priority Data

Oct. 19, 1999 (JP) .............................................. 11-297126

(51) Int. Cl.[7] ................................................ H05K 3/36
(52) U.S. Cl. .............................. 29/830; 29/840; 29/847; 361/321; 361/401
(58) Field of Search ..................... 29/830, 840, 25.42, 29/847; 361/401, 321

(56) References Cited

U.S. PATENT DOCUMENTS

| | | | |
|---|---|---|---|
| 4,821,007 A | * | 4/1989 | Fields et al. |
| 5,010,641 A | * | 4/1991 | Sisler |
| 5,162,977 A | * | 11/1992 | Paurus et al. |
| 5,261,153 A | * | 11/1993 | Lucas |
| 5,400,039 A | * | 3/1995 | Araki et al. |
| 5,741,729 A | * | 4/1998 | Selna |
| 5,796,587 A | * | 8/1998 | Laufer et al. |

FOREIGN PATENT DOCUMENTS

JP          07-022757    *   1/1995

* cited by examiner

Primary Examiner—Carl J. Arbes
(74) Attorney, Agent, or Firm—Paul & Paul

(57) ABSTRACT

A multi-layer circuit board comprises: an insulating layer having upper and lower surfaces thereof, and wiring patterns arranged on the upper and lower surfaces of the insulating layer. A ferroelectric layer has a dielectric constant larger than that of the insulating layer and has upper and lower surfaces. The ferroelectric layer is arranged in the insulating layer in such a manner that the upper and lower surfaces of the ferroelectric layer coincide with the upper and lower surfaces of the insulating layer, respectively. A pair of electrode films are formed on the upper and lower surfaces of the ferroelectric layer, respectively, to define a capacitor incorporated in the multi-layer circuit board.

2 Claims, 3 Drawing Sheets

METHOD OF MAKING MULTILAYER CIRCUIT BOARD

CROSS-REFERENCE TO RELATED APPLICATIONS

This is a divisional application of U.S. application Ser. No. 09/690,375 filed Oct. 17, 2000.

BACKGROUND OF THE INVENTION

1. Field of the Invention

The present invention relates to a multi-layer circuit board and, more particularly, to a multi-layer circuit board having a capacitor incorporated therein. The present invention also relates to a process for manufacturing such a multi-layer circuit board.

2. Description of the Related Art

In a multi-layer circuit board on which a semiconductor element is mounted, a capacitor is incorporated therein so as to absorb noise. In a multi-layer circuit board known in the prior art, in order to absorb such noise, a chip capacitor is attached to the outside of the multi-layer circuit board.

However, in a multi-layer circuit board having a chip capacitor attached to the outside thereof, the distance between the semiconductor element and the capacitor is relatively large and, therefore, the noise absorbing effect is not sufficient. Also, there is another problem in that the size of the device including the capacitor is increased.

SUMMARY OF THE INVENTION

Accordingly, an object of the present invention is to provide a multi-layer circuit board having a capacitor incorporated therein and a process for manufacturing the same, wherein the circuit board has a sufficient noise absorbing effect and the size thereof can be reduced.

Another object of the present invention is to provide a multi-layer circuit board and a process for manufacturing the same, wherein the above-mentioned drawbacks in the prior art can be avoided.

According to the present invention, there is provided a multi-layer circuit board comprising: at least one insulating layer having upper and lower surfaces thereof; wiring patterns arranged on the upper and lower surfaces of the insulating layer; a ferroelectric layer having a dielectric constant larger than that of the insulating layer and having upper and lower surfaces, the ferroelectric layer being arranged in the insulating layer in such a manner that the upper and lower surfaces of the ferroelectric layer coincide with the upper and lower surfaces of the insulating layer, respectively; and a pair of electrode films formed on the upper and lower surfaces of the ferroelectric layer, respectively, to define a capacitor incorporated in the circuit board.

According to another aspect of the present invention, there is provided a multi-layer circuit board comprising: at least one insulating layer having upper and lower surfaces thereof; wiring patterns arranged on the upper and lower surfaces of the insulating layer; a ferroelectric layer having a dielectric constant larger than that of the insulating layer and having a thickness smaller than that of the insulating layer, the ferroelectric layer being arranged within the thickness of the insulating layer; a pair of electrode films formed on the upper and lower surfaces of the insulating layer at a position to sandwich the ferroelectric layer via the insulating layer to define a capacitor incorporated in the circuit board.

In the above-mentioned multi-layer circuit board, one of the pair of electrode films and the wiring pattern which exists on the same surface of the one electrode film are electrically connected to a ground layer.

Also, in the above-mentioned multi-layer circuit board, the ferroelectric layer is made of a material selected from strontium titanate, lead zirconium titanate, tantalate oxide, or aluminum oxide.

According to another aspect of the present invention, there is provided a process for manufacturing a multi-layer circuit board comprising wiring patterns arranged in multi-layer by means of insulating layers, the process comprising: forming a ferroelectric layer on an upper conductor layer formed on a base support, in which the ferroelectric layer has a dielectric constant larger than that of the insulating layers and the base support is made of a material which is removable by etching; partially removing the ferroelectric layer so as to form a desired ferroelectric layer pattern; covering the ferroelectric layer pattern and the exposed upper conductor layer with an insulating layer; grinding the insulating layer so that the ferroelectric layer pattern is exposed; forming a lower conductor layer on the ground insulating layer; etching and removing the base support; and etching the upper and lower conductor layers to form desired wiring patterns in such a manner that electrode films of the wiring patterns are also formed to sandwich the ferroelectric layer pattern from respective sides thereof.

According to another aspect of the present invention, there is provided a process for manufacturing a multi-layer circuit board comprising wiring patterns arranged in multi-layer by means of insulating layers, the process comprising: forming a ferroelectric layer on a base support, in which the ferroelectric layer has a dielectric constant larger than that of the insulating layers and the base support is made of a material which is removable by etching; forming an upper insulating layer on the ferroelectric layer; forming a third conductor layer on the upper insulating layer; etching and removing the base support; partially removing the ferroelectric layer so as to form a desired ferroelectric layer pattern; covering the ferroelectric layer pattern and the exposed upper conductor layer with an insulating layer; forming a fourth conductor layer on the lower insulating layer; and etching the third and fourth conductor layers to form desired wiring patterns in such a manner that electrode films of the wiring patterns are also formed on the upper and lower insulating layers to sandwich the ferroelectric layer pattern from respective sides thereof via the upper and lower insulating layers.

DETAILED DESCRIPTION OF THE EMBODIMENTS

Figure 1:
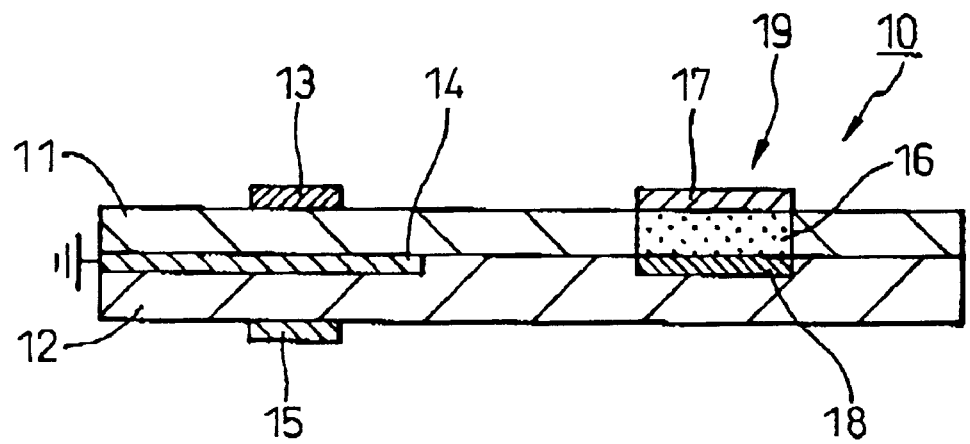
FIG. 1 is a partial cross-sectional view of a first embodiment of a multi-layer circuit board according to the present invention.

Referring now to the attached drawings, some preferred embodiments of the present invention will now be described, wherein FIG. 1 shows a partial cross-sectional view of a multi-layer circuit board 10 according to a first embodiment of the present invention.

The multi-layer circuit board 10 comprises insulating layers 11 and 12 and wiring patterns 13, 14 and 15 formed on and between the respective layers 11 and 12 to form a multi-layer circuit board. Although the multi-layer circuit board 10 in this embodiment consists of two layers, it may include more than two layers. Such a multi-layer circuit board can be made by laminating insulating layers and wiring patterns, in turn, by any known process such as a build-up process.

A ferroelectric layer 16 having a dielectric constant larger than that of the insulating layer 11 is formed within the insulating layer 11 in such a manner that the upper and lower surfaces thereof exactly coincide with the respective upper and lower surfaces of the insulating layer 11.

Electrode layers 17 and 18 are formed on the respective upper and lower surfaces of the ferroelectric layer 16 and a capacitor 19 which is built into the multi-layer circuit board 10 is thus formed.

Generally speaking, recently, the width of the signal lines in the wiring patterns 13 and 15 has a tendency to become smaller and smaller, such as to a few $\mu m$ or the like.

Under such a situation that the width of the signal lines has become smaller and smaller, the thickness of the insulating layer must necessarily become smaller and smaller so as to maintain a matching impedance.

According to one embodiment of this invention, owing to the fact that the thickness of the insulating layer has become thiner and thiner, it becomes possible a to build a capacitor 19, having a high capacity, in within the circuit board itself.

Namely, the ferroelectric layer 16 constituting a capacitor 19 is formed so that the thickness thereof is the same as that of the insulating layer 11. Thus, a capacitor 19 is formed within the insulating layer 11 in such a manner that the upper and lower surfaces thereof coincide with the respective upper and lower surfaces of the insulating layer 11. Thus, the thickness of the ferroelectric layer 16 can be made much thinner, to the same thickness as that of the insulating layer 11, and thus the capacity of the capacitor 19 can thus be increased.

The ferroelectric layer 16 is made of a ferroelectric substance selected from those having a dielectric constant which is larger than that of the insulating layer 11 made of resin, such as strontium titanate ($SrTiO_3$), lead zirconium titanate ($PbZr_xTi_{1-x}O_3$), barium titanate ($BaTiO_3$), tantalum oxide ($Ta_2O_5$), or aluminum oxide ($Al_2O_3$). Thus, a capacitor 19 having a high capacity can be formed.

As mentioned above, according to the first embodiment of the present invention, the capacitor 19 having a high capacity is built into the interior of the circuit board 19 and, therefore, a size of the device itself can be diminished and a multilayer circuit board having a good noise absorbing characteristic can thus be obtained.

One 18 of electrode films and the wiring pattern 15 on the side on which the electrode film 18 exists are formed as the ground layer. Thus, an electric characteristic can still be improved.

Figure 2:
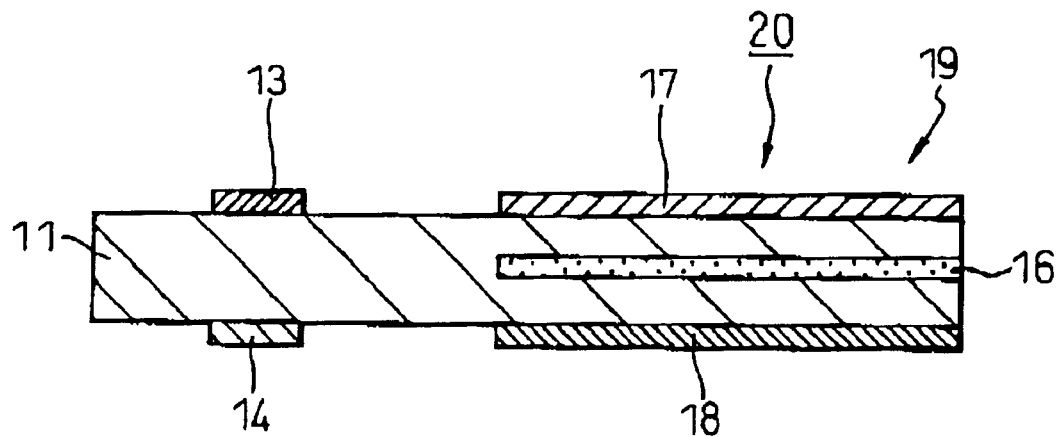
FIG. 2 is a partial cross-sectional view of a second embodiment of a multi-layer circuit board according to the present invention.

In a second embodiment of the multi-layer circuit board 20 shown in FIG. 2, a ferroelectric layer 16 having a dielectric constant larger than that of the insulating layer 11 is formed, in such a manner that the ferroelectric layer 16 is arranged in the range of the thickness of the insulating layer 11. A pair of electrode films 17 and 18 are formed on the insulating layer at positions to sandwich the ferroelectric layer 16 from the respective sides via the insulating layer 11 so as to define a capacitor 19.

In this multilayer circuit board 20, it is preferable that one of the electrodes 18 and the circuit pattern 14 at the side where the one electrode 18 exists are formed as the ground layer. In the same manner as the above, the ferroelectric layer 16 can be made of a material selected from strontium titanate, lead zirconium titanate, barium titanate tantalum oxide, or aluminum titanate, lead zirconium titanate, tantalate oxide, or aluminum oxide.

In the embodiment of the multi-layer circuit board 20 of this type, since the capacitor 19 having a high capacity is accommodated within the thickness of the circuit board, a multi-layer circuit board 20 in which the size of the device itself can thus be reduced, and has a good noise absorbing characteristic, can thus be obtained.

Figure 3A:
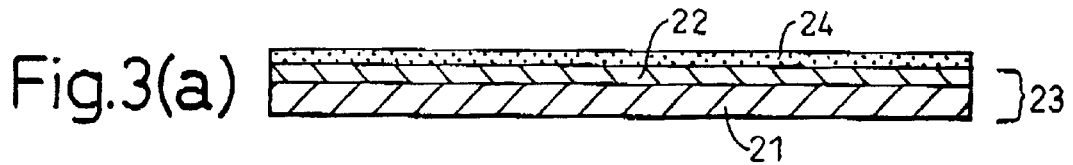
FIGS. 3(a) to 3(i) are cross-sectional views showing a process for manufacturing the first embodiment of a multi-layer circuit board.

FIGS. 3(a) to 3(i) illustrate an embodiment of manufacturing process of a multi-layer circuit board 10 shown in FIG. 1. First, as shown in FIG. 3(a), a first conductor layer 22, such as copper, is formed on a support body 21 made of a material, such as aluminum or the like, removable by etching at a later step, so that a mother material 23 is formed. A ferroelectric layer 24 having a dielectric constant larger than that of the insulating layer 11 is formed on the first conductor layer 22 of the mother material 23. It is preferable that the ferroelectric layer 24 is formed by sputtering or CVD (chemical vapor deposition) coating. The first conductor layer 22 can be formed on the support body 21 by adhering a plated copper or copper foil thereto.

Figure 3B:

Next, as shown in FIG. 3(b), a part of the ferroelectric layer 24 is removed so that a desired ferroelectric pattern 16 can be formed. This removing process can be performed by a known photolithographic etching process.

Figure 3C:
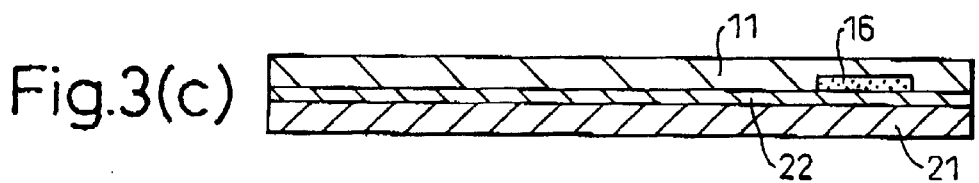
Figure 3D:

Next, as shown in FIG. 3(c), an insulating layer 11 is formed so as to cover the ferroelectric layer forming such a pattern as mentioned above. The insulating layer 11 can be formed by coating a resin, such as polyimide or polyphenylene ether, or the like material, or adhering such a resin sheet. Then, as shown in FIG. 3(d), the insulating layer 11 is ground so that the surface of the ferroelectric layer 16 can be exposed. That is to say, the surface of the insulating layer 11 and the surface of the ferroelectric layer 16 are made to coincide with each other.

Figure 3E:
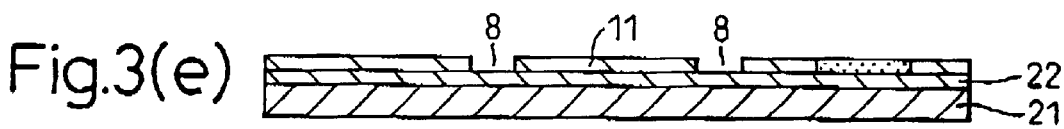

Next, as shown in FIG. 3(e), via holes 8 are drilled in the insulating layer 11. The vial holes 8 can be formed by a laser drilling. The insulating layer 11 can also be formed by using a photosensitive polyimide resin. In this case, the via holes 8 can be formed by exposing to light and developing such a photosensitive polyimide resin.

Figure 3F:
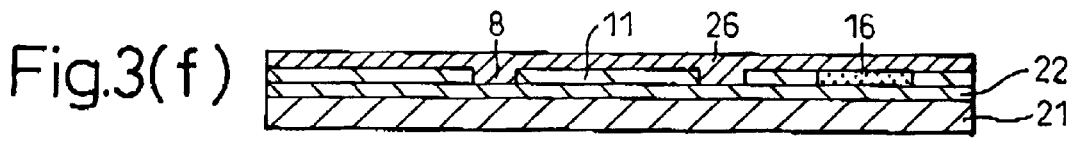
Figure 3G:
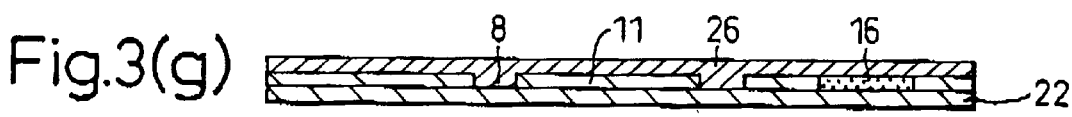

Next, as shown in FIG. 3(f), an electroless copper plated layer is formed and then an electro-plated copper layer is formed to make a second conductor layer 26 on the surface of the via hole 8 and on the surface of the insulating layer 11. Then, as shown in FIG. 3(g), the support body 21 made of aluminum is removed by etching. Since the first conductor layer 22 and the second conductor layer 26 are formed on the respective surfaces of the insulating layer 11, the board has sufficient strength even though the support body 21 has been removed.

Figure 3H:
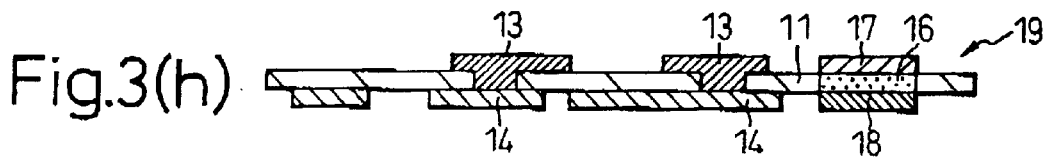
Figure 3I:
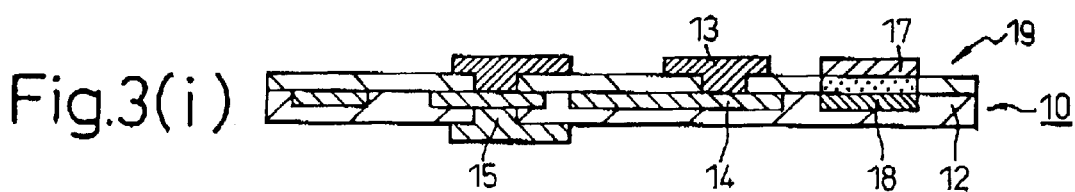
Figure 4A:
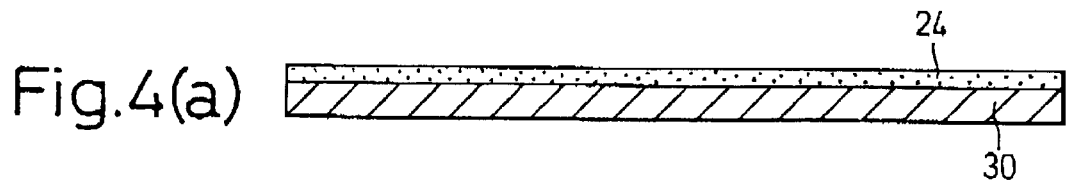
FIGS. 4(a) to 4(f) are cross-sectional views showing a process for manufacturing the second embodiment of a multi-layer circuit board
Figure 4B:
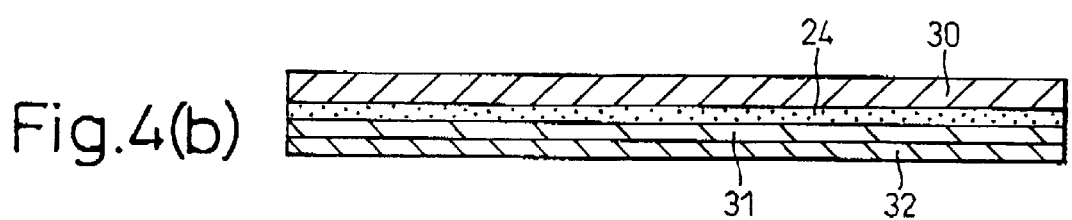
Figure 4C:
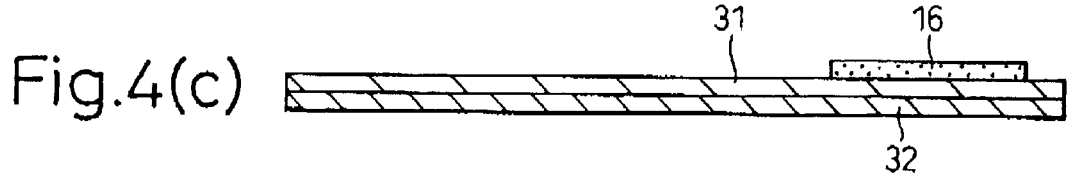
Figure 4D:
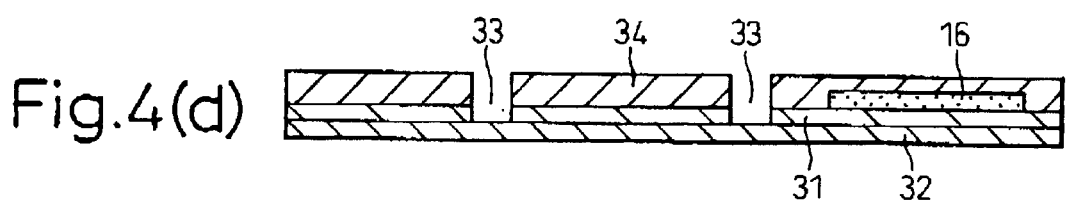
Figure 4E:
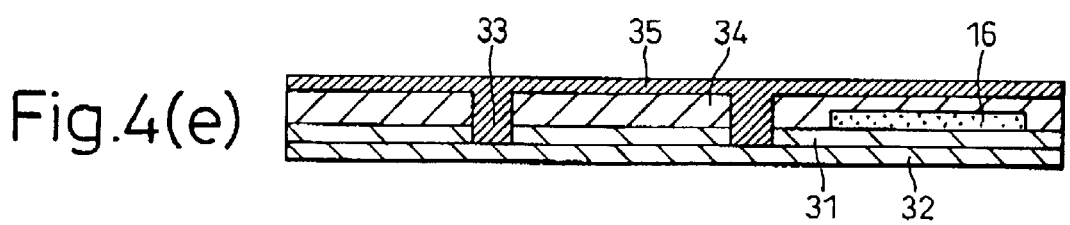
Figure 4F:
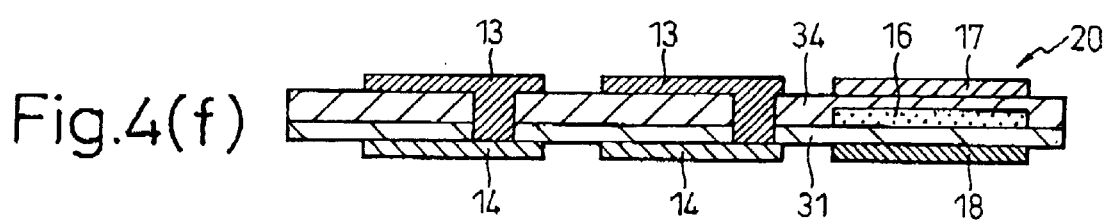

Next as shown in FIG. 3(h), the first and second conductor layers 22 and 26 are etched to form electrode films 17 and 18 for sandwiching the wiring patterns 13 and 14 and the ferroelectric layer 16 from the respective sides. Thus, a capacitor 19 can be built into in the circuit board. The wiring patterns 13 and 14 are electrically connected to each other by means of the plated film formed in the via holes 8. On the other hand, it is preferable-that one 14 of the wiring patterns and the electrode film 18 are electrically connected to the ground.

FIG. 3(*i*) shows that the wiring pattern 15 is formed on the insulating layer 12 by a built-up method. As mentioned above, a multi-layer circuit board 10 can thus be made in which a capacitor 19 is incorporated therein by using both a build-up method and a sputtering method. Of course, a desired number of capacitors can be arranged in desired layers in this multi-layer circuit board 10. It is of course preferable, in order to absorb possible noise, that the capacitor is arranged in the vicinity of a semiconductor element (not shown) which is to be mounted on the circuit board 10.

FIGS. 4(*a*) to 4(*f*) illustrate an embodiment of a manufacturing process of a multi-layer circuit board 20 shown in FIG. 2. First, as shown in FIG. 4(*a*), a ferroelectric layer 24 having a dielectric constant larger than that of the resin material is formed on a support body 30 made of a material, such as aluminum or the like material, removable by etching at a later stage. It is preferable that the ferroelectric layer 24 is formed by sputtering or CVD coating.

Next, as shown in FIG. 4(*b*), a first insulating layer 31 is formed on the ferroelectric layer 24 and a third conductor layer 32 is formed on the first insulating layer 31 by electro copper plating, electroless copper plating or the like. The first insulating layer 31 can be formed by coating a resin, such as polyimide or polyphenylene ether, or adhering such a resin sheet. Otherwise, the first insulating layer 31 can be formed by coating or adhering a resin, such as a photosensitive resin.

Then, as shown in FIG. 4(*c*), the support body 30 is removed by etching. Also, a part of the ferroelectric layer 24 is removed to form a ferroelectric layer 16 having a desired pattern. This process can be performed by etching in a photolithographic process. Since the first insulating layer 31 and the third conductor layer 32 are formed on the respective surfaces of the ferroelectric layer 24 the board has a sufficient strength even though the support body 30 has been removed.

Next, as shown in FIG. 4(*d*), after a second insulating layer 34 is formed so as to cover the ferroelectric layer 16 and the first insulating layers 31, via holes 33 are formed at desired positions on the first and second insulating layers 31 and 34 by a laser drilling process. The first and second insulating layers 31 and 34 may also be formed by using a photosensitive resin and via holes 33 may be formed by exposing to light and developing the photosensitive resin.

Next as shown in FIG. 4(*e*), a fourth conductor layer 35 is formed on the second insulating layer 34 and on the surfaces of the via holes 33 by electroless copper plating and electro copper plating. Then as shown in FIG. 4(*f*), the third and fourth conductor layers 32 and 35 are etched to form wiring patterns 13 and 14 and electrode films 17 and 18 are formed at positions on the first and second insulating layers 31 and 34 so as to sandwich the ferroelectric layer 24 on respective sides. Thus, a capacitor 19 can be built into the circuit board. The wiring patterns 13 and 14 are electrically connected to each other by means of the plated film formed in the via holes. On the other hand, it is preferable that the wiring pattern 14 and the electrode film 18 are electrically connected to the ground.

In addition, a multi-layer circuit board 20 can be made in which a capacitor is incorporated therein by using a build-up method to form the wiring patterns. In this way a multi-layer circuit board 20 having a capacitor 19 incorporated therein can be formed by using both a build-up method and a sputtering method. Of course, a desired-number-of-capacitors 19 can be arranged in desired layers in the multi-layer circuit board 20. It is of course preferable, in order to absorb possible noise, that the capacitor is arranged in the vicinity of a semiconductor element (not shown) which is to be mounted the circuit board 20.

It should be understood by those skilled in the art that the foregoing description relates to only some preferred embodiments of the disclosed invention, and that various changes and modifications may be made to the invention without departing from the spirit and scope thereof.

What is claimed is:

1. A process for manufacturing a multi-layer circuit board comprising wiring patterns arranged in multi-layer by means of insulating layers, said process comprising:

forming a ferroelectric layer on a first conductor-layer formed on a base support, in which said ferroelectric layer has a dielectric constant larger than that of the insulating layers and said base support is made of a material which is removable by etching;

partially removing said ferroelectric layer so as to form a desired ferroelectric layer pattern;

covering said ferroelectric layer pattern and said exposed first conductor layer with an insulating layer;

grinding said insulating layer so that said ferroelectric layer pattern is exposed;

forming a second conductor layer on said ground insulating layer;

etching and removing said base support;

etching said first and second conductor layers to form desired wiring patterns in such a manner that electrode films of said wiring patterns are also formed to sandwich said ferroelectric layer pattern from the respective sides thereof.

2. A process for manufacturing a multi-layer circuit board comprising wiring patterns arranged in multi-layer by means of insulating layers, said process comprising:

forming a ferroelectric layer on a base support, in which said ferroelectric layer has a dielectric constant larger than that of the insulating layers and said base support is made of a material which is removable by etching;

forming a first insulating layer on said ferroelectric layer;

forming a third conductor layer on said first insulating layer;

etching and removing said base support;

partially removing said ferroelectric layer so as to form a desired ferroelectric layer pattern;

covering said ferroelectric layer pattern and said exposed first insulating layer with a second insulating layer;

forming a fourth conductor layer on said second insulating layer;

etching said third and fourth conductor layers to form desired wiring patterns in such a manner that electrode films of said wiring patterns are also formed on said first and second insulating layers to sandwich said ferroelectric layer pattern from the respective sides thereof via said first and second insulating layers.

\* \* \* \* \*